United States Patent
Saito et al.

(10) Patent No.: US 6,658,609 B1
(45) Date of Patent: Dec. 2, 2003

(54) SEMICONDUCTOR MEMORY DEVICE WITH A TEST MODE

(75) Inventors: Syuichi Saito, Kasugai (JP); Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/441,803

(22) Filed: Nov. 17, 1999

(30) Foreign Application Priority Data

Nov. 20, 1998 (JP) .......................................... 10-330633

(51) Int. Cl.$^7$ .............................................. G11C 29/00
(52) U.S. Cl. ...................................... 714/718; 365/201
(58) Field of Search ........................... 714/718; 365/201

(56) References Cited

U.S. PATENT DOCUMENTS

| | | | | | |
|---|---|---|---|---|---|
| 4,821,238 A | * | 4/1989 | Tatematsu | ................... | 365/201 |
| 5,400,342 A | * | 3/1995 | Matsumura et al. | ........ | 714/719 |
| 5,682,389 A | * | 10/1997 | Nizaka | ...................... | 714/718 |
| 5,706,233 A | * | 1/1998 | Ooishi | ........................ | 365/201 |
| 6,088,819 A | * | 7/2000 | Adachi et al. | ................. | 327/77 |
| 6,094,734 A | * | 7/2000 | Beffa et al. | ................. | 365/201 |
| 6,118,722 A | * | 9/2000 | Jeon et al. | ................... | 365/201 |

FOREIGN PATENT DOCUMENTS

JP  9-167487  6/1997  ......... G11C/11/407

* cited by examiner

*Primary Examiner*—Phung M. Chung
*Assistant Examiner*—Esaw Abraham
(74) *Attorney, Agent, or Firm*—Arent Fox Kintner Plotkin & Kahn, PLLC

(57) ABSTRACT

A semiconductor memory device includes a memory cell array having memory cells located at the intersections of bit lines and word lines. Driver circuits are connected to groups of the word lines. A first decoder circuit is connected to the driver circuits to selectively activate them. A second decoder circuit is also connected to the driver circuits to activate selected ones of the word lines. In response to a test signal, the first decoder circuit simultaneously activates all of the driver circuits and the second decoder circuit activates the selected ones of the word lines.

17 Claims, 10 Drawing Sheets

SEMICONDUCTOR MEMORY DEVICE WITH A TEST MODE

BACKGROUND OF THE INVENTION

The present invention relates to a semiconductor memory device, and more particularly, to a semiconductor memory device having a test mode.

In recent years, the increase in the capacity of semiconductor memory devices has increased the time required for testing such devices. One of the tests is the application of stress to the memory cell array. It is desirable that the stress application test be conducted within a short period of time.

To guarantee the reliability of a semiconductor memory device, an acceleration test is conducted on the device before it is shipped out of the factory. The acceleration test is conducted under high temperature and high pressure conditions by applying stress to the internal circuits of the chip. The level of the stress exceeds the level of the stress applied during normal usage. Initial stage failures are screened out through the acceleration test. Such test is normally referred to as burn-in. The burn-in is conducted on word lines by applying stress to the word lines. That is, voltage, the level of which is increased and decreased, is selectively applied to the word lines. In a normal mode, the word lines are selected in sequential order. In a test mode, all of the word lines are selected simultaneously.

However, when the word lines are selected in sequential order, the test time increases proportionally to the number of word lines. When all of the word lines are selected simultaneously, although DC stress, in which the potential difference between predetermined word lines is null, can be applied, AC stress, in which a potential difference occurs between word lines, cannot be applied.

SUMMARY OF THE INVENTION

Accordingly, it is an object of the present invention to provide a semiconductor memory device that is capable of applying DC/AC stress to word lines within a short period of time.

To achieve the above object, the present invention provides a semiconductor memory device including a memory cell array having a plurality of memory cells, each arranged at an intersection between one of a plurality of word lines and one of a plurality of bit lines. The plurality of word lines form a plurality of word line groups. The semiconductor memory device also includes a plurality of driver circuits, each connected to one of the plurality of word line groups. A first decoder circuit is connected to the plurality of driver circuits to selectively activate the driver circuits. A second decoder circuit is connected to the plurality of driver circuits to select predetermined ones of the word lines in each of the plurality of word line groups. The first decoder circuit substantially simultaneously activates the plurality of driver circuits in response to a test mode signal and the second decoder circuit selects the predetermined word lines in predetermined patterns in response to the test mode signal.

In a further aspect of the present invention, a semiconductor memory device includes a memory cell array having a plurality of memory cells, each arranged at an intersection between one of a plurality of word lines and one of a plurality of bit lines. The plurality of word lines form a plurality of first word line groups and a plurality of second word line groups., A plurality of first driver circuits and a plurality of second driver circuits are connected to the plurality of first word line groups and the plurality of second word line groups, respectively. A first decoder circuit is connected to the plurality of first driver circuits and the plurality of second driver circuits to selectively activate the first and second driver circuits. A second decoder circuit is connected to the plurality of first driver circuits and the plurality of second driver circuits to select predetermined word lines in each of the plurality of first and second word line groups. The first decoder circuit substantially simultaneously activates the plurality of first and second driver circuits in accordance with a test mode signal and the second decoder circuit selects the predetermined word lines in predetermined patterns in accordance with the test mode signal.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
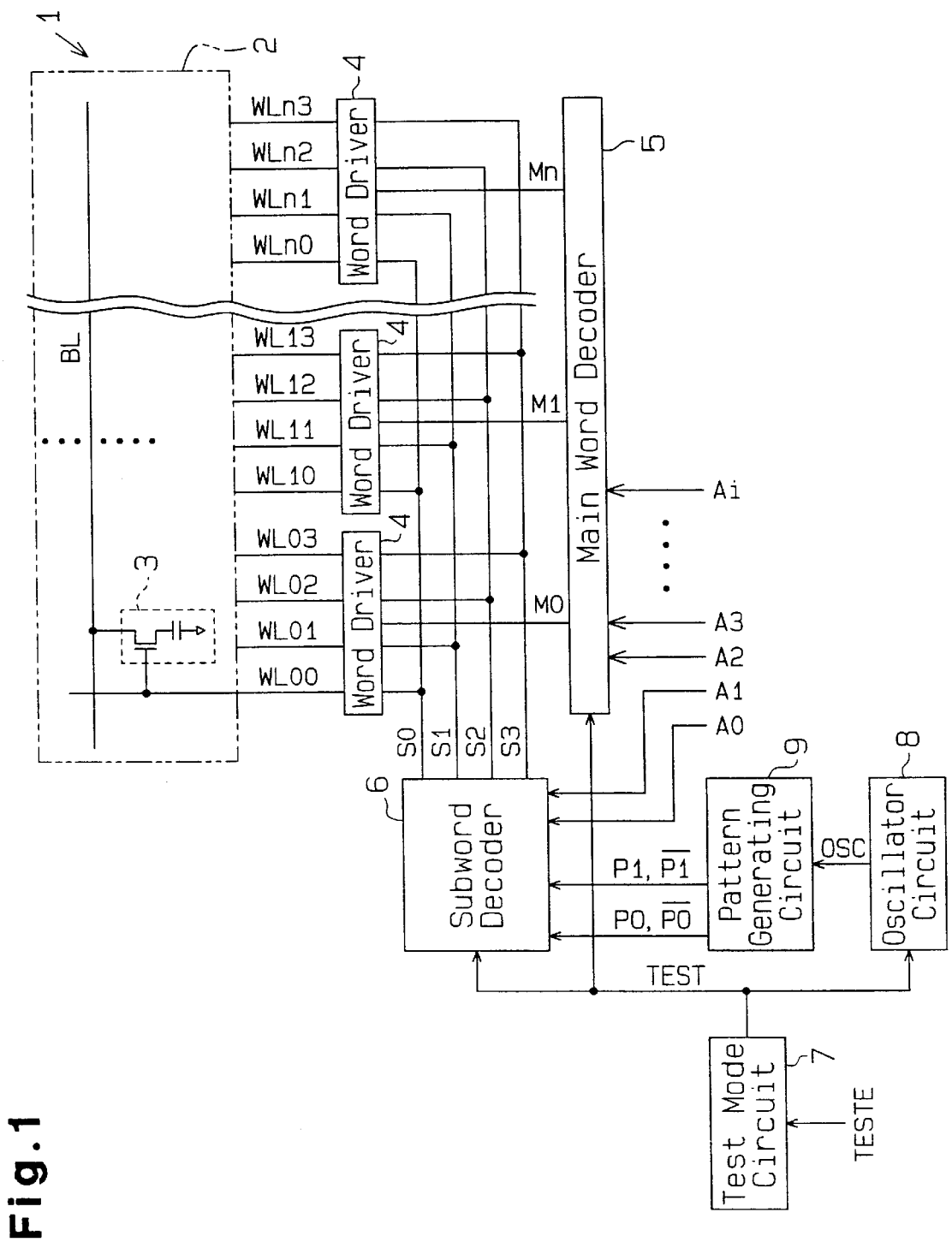
FIG. 1 is a schematic block diagram showing a semiconductor memory device according to a first embodiment of the present invention.

In the drawings, like numerals are used for like elements throughout.

FIG. 1 is a block diagram showing a semiconductor memory device (DRAM) 1 according to a first embodiment of the present invention. The semiconductor memory device 1 includes a memory cell array 2. The memory cell array 2 is provided with a matrix of memory cells 3. Each memory cell 3 has a capacitor and a MOS transistor and is arranged at the intersection of one of a plurality of word lines WL (WL00–WLnn) and one of a plurality of bit lines BL. The bit lines BL are connected to a column decoder (not shown).

The column decoder generates a column decode signal used to select one of the bit lines BL. The word lines WL are connected to word drivers 4. The word drivers 4 select a word line WL in accordance with row address signals A0–Ai.

More specifically, each word driver 4 is associated with a group of four word lines. Each word driver 4 is connected to a main word decoder 5 and a subword decoder 6. The main word decoder 5 receives the row address signals A2–Ai and sends corresponding main decode signals M0–Mn to the word drivers 4. This selects (activates) the word driver 4 associated with the row address signals A2–Ai.

The subword decoder 6 receives row address signals A0, A1 and sends corresponding subdecode signals S0–S3 to the word drivers 4. This drives one of the word lines in the word line group connected to the activated word driver 4.

The semiconductor memory device 1 further includes a test mode circuit 7, an oscillator circuit 8, and a pattern generating circuit 9. The test mode circuit 7 receives a test mode entry signal TESTE from an external input apparatus (not shown), such as a testing apparatus, and sends a high test mode signal TEST to the main word decoder 5, the subword decoder 6, and the oscillator circuit 8, instructing them to enter the test mode and conduct the burn-in test.

The oscillator circuit 8 is activated by the high test mode signal TEST and sends an oscillation signal OSC to the pattern generating circuit 9. The pattern generating circuit 9 sends word line selection signals P0, /P0, P1, /P1 to the subword decoder 6 in accordance with the oscillation signal OSC from the oscillator circuit 8.

The main word decoder 5 receives the test mode signal TEST from the test mode circuit 7, sends the main decode signals M0–Mn to each word driver 4, and activates all of the word drivers 4. The subword decoder 6 receives the test mode signal TEST from the test mode circuit 7 and the word line selection signals P0, /P0, P1, /P1 from the pattern generating circuit 9 and sends subdecode signals S0–S3 to each word driver 4 in accordance with the word line selection signals P0, /P0, P1, /P1. All of the activated word drivers 4 simultaneously drive a predetermined number of the word lines in accordance with the subdecode signals S0–S3.

The word drivers 4, the main word decoder 5, the subword decoder 6, the oscillator circuit 8, and the pattern generating circuit 9 will now be described.

Figure 2:
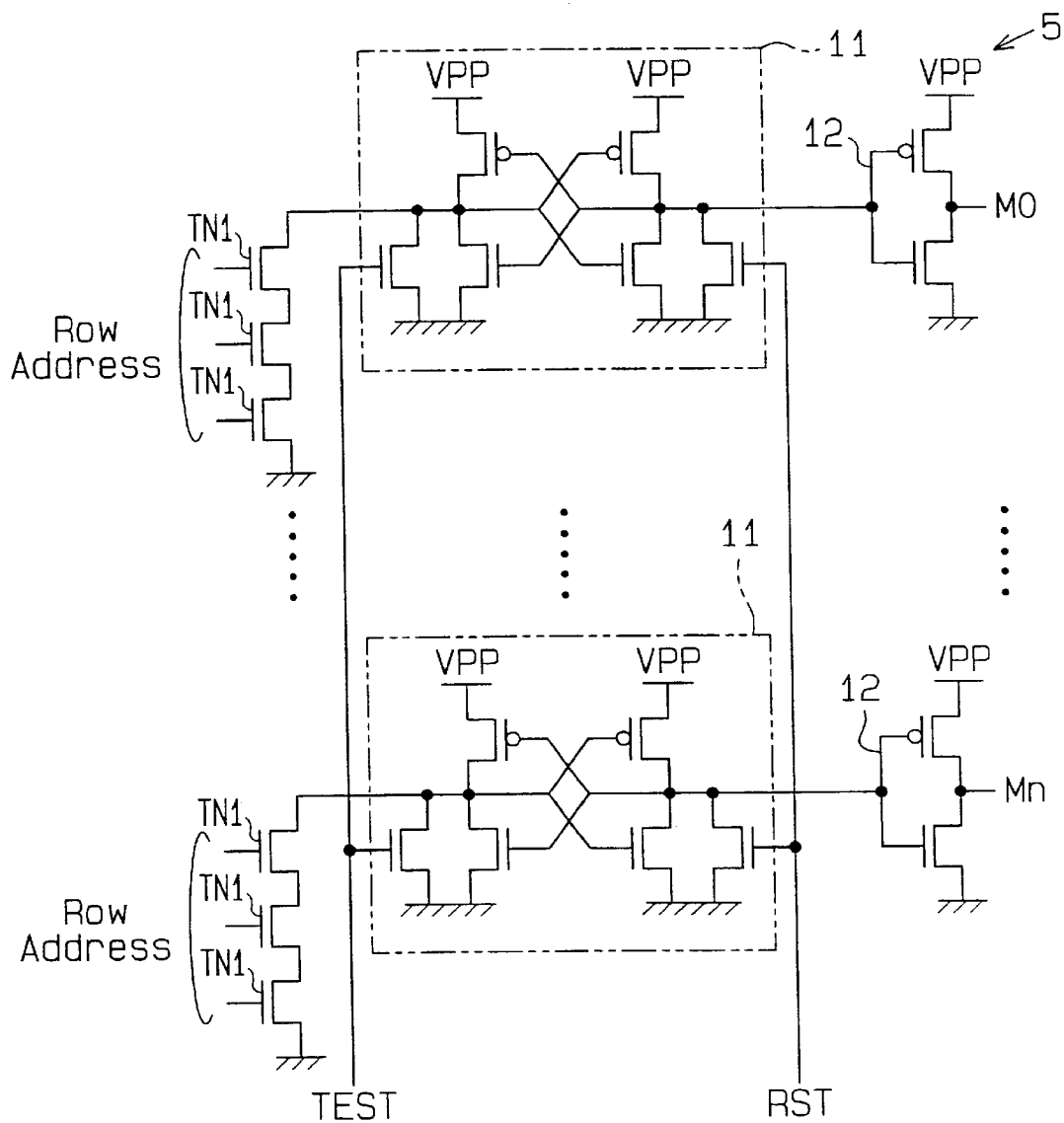
FIG. 2 is a circuit diagram showing a main word decoder of the semiconductor memory device of FIG. 1.

As shown in FIG. 2, the main word decoder 5 includes plural groups of NMOS transistors TN1 connected in series with one another, a plurality of latch circuits 11 provided with reset/set functions, and a plurality of inverter circuits 12. The gate terminal of each transistor TN1 in the first transistor group receives a row address signal corresponding to the main decode signal M0. When all of the transistors TN1 are activated in response to the row address signal, a low signal is sent to the latch circuit 11. A low signal sets the latch circuit 11 and causes a high signal to be output from the latch circuit 11. The inverter circuit 12 receives and inverts the high signal and outputs a low main decode signal M0.

The latch circuit 11 is set by a high test mode signal TEST. This causes the inverter circuit 12 to output a low main decode signal M0. Further, the latch circuit 11 is reset by a high word line reset signal RST. This causes the inverter circuit 12 to output a high main decode signal M0.

Each set of the corresponding transistor TN1 group, the latch circuit 11, and the inverter circuit 12 is arranged in association with the main decode signals M0–Mn. The row address signal corresponding to the main decode signal M0–Mn is sent to the gate terminals of the transistors TN1. In other words, the main decode signal M0–Mn corresponding to the associated row address signal A2–Ai goes low during normal operation. When entering a test mode, a high test mode signal TEST causes all of the main decode signals M0–Mn to go low.

The main word decoder 5 is driven by a word line drive internal power supply Vpp, which is greater than a normal internal power supply Vdd, and outputs the main decode signal M0–Mn which have the voltage of the internal power supply Vpp. This provides the capacitors of the memory cells 3 (FIG. 1) with the internal power supply Vdd at full level. In other words, a voltage higher than that of the internal power supply Vdd is applied to the gate terminals of the transistors of the memory cells 3 via the word lines WL.

Figure 3:
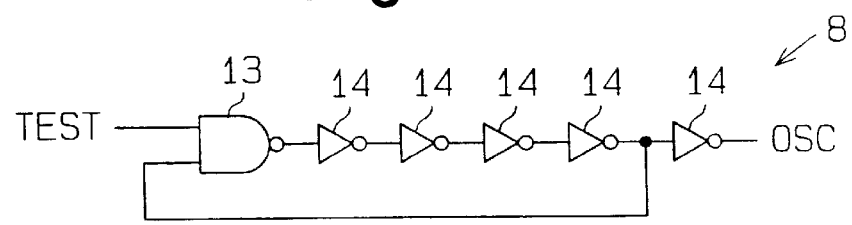
FIG. 3 is a schematic diagram showing an oscillator circuit of the semiconductor device of FIG. 1.

The oscillator circuit 8 will now be described. As shown in FIG. 3, the oscillator circuit 8 is preferably a ring oscillator and includes one NAND circuit 13 and five inverters 14. The oscillator circuit 8 is activated by a high test mode signal TEST to generate an oscillation signal OSC having a predetermined cycle.

Figure 4:
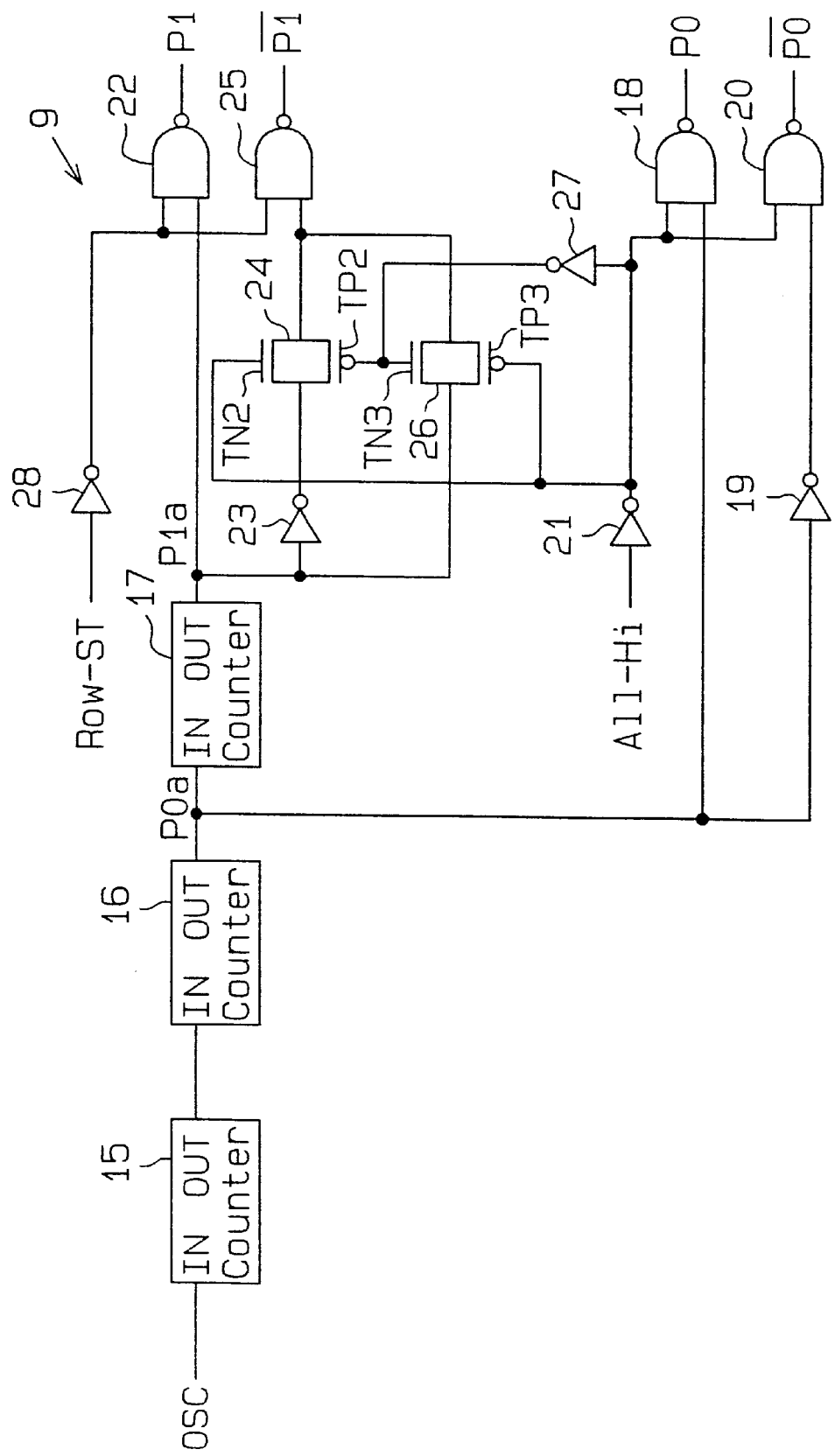
FIG. 4 is a schematic diagram showing a pattern generating circuit of the semiconductor memory device of FIG. 1.

The pattern generating circuit 9 will now be described. As shown in FIG. 4, the pattern generating circuit 9 includes a three bit binary counter having three counters 15, 16, 17 connected in series. The first counter 15 receives the oscillation signal OSC from the oscillator circuit 8. The output terminal of the second counter 16 is connected to a first input terminal of a NAND circuit 20 via an inverter 19, a first input terminal of a NAND circuit 18, and the input terminal of the third counter 17. The NAND circuit 18 also receives a control signal All-Hi through its second input terminal from the test mode circuit 7 and outputs a word line selection signal P0. The NAND circuit 20 also receives the control signal All-Hi and outputs a word line selection signal /P0.

The output terminal of the counter 17 is connected to a first input terminal of the NAND circuit 22. The NAND circuit 22 receives an output signal P1a of the counter 17 at its first input terminal, receives a control signal Row-ST inverted by an inverter 28 at its second input terminal and outputs a word line selection signal P1. The output terminal of the counter 17 is further connected to a first input terminal of a NAND circuit 25 via an inverter 23 and a transmission gate 24 and via a transmission gate 26. The NAND circuit 25 also receives the control signal Row-ST inverted by the inverter 28 at its second input terminal and outputs a word line selection signal /P1.

The transmission gate includes an NMOS transistor TN2 and a PMOS transistor TP2 and the transmission gate includes an NMOS transistor TN3 and a PMOS transistor TP3.

The gate terminal of the NMOS transistor TN2 of the transmission gate 24 and the gate terminal of the PMOS transistor TP3 of the transmission gate 26 receive the control signal All-Hi via the inverter 21. The gate terminal of the PMOS transistor TP2 of the transmission gate 24 and the gate terminal of the NMOS transistor TN3 of the transmission gate 26 receive the control signal All-Hi via the inverter 21 and a further inverter 27.

When the control signal All-Hi is low, the transmission gate 24 is activated and the transmission gate 26 is deactivated. Accordingly, the output signal P1a of the counter 17 is inverted by the inverter 23 and sent to the NAND circuit 25 via the transmission gate 24. When the control signal All-Hi is high, the transmission gate 24 is deactivated and the transmission gate 26 is activated. Accordingly, the output signal P1a of the counter 17 is sent to the NAND circuit 25 via the transmission gate 26. It is preferable that the control signal All-Hi and the control signal Row-ST be generated by the test mode circuit 7. However, these signals may also be generated by an external input apparatus such as a testing apparatus.

Figure 5:
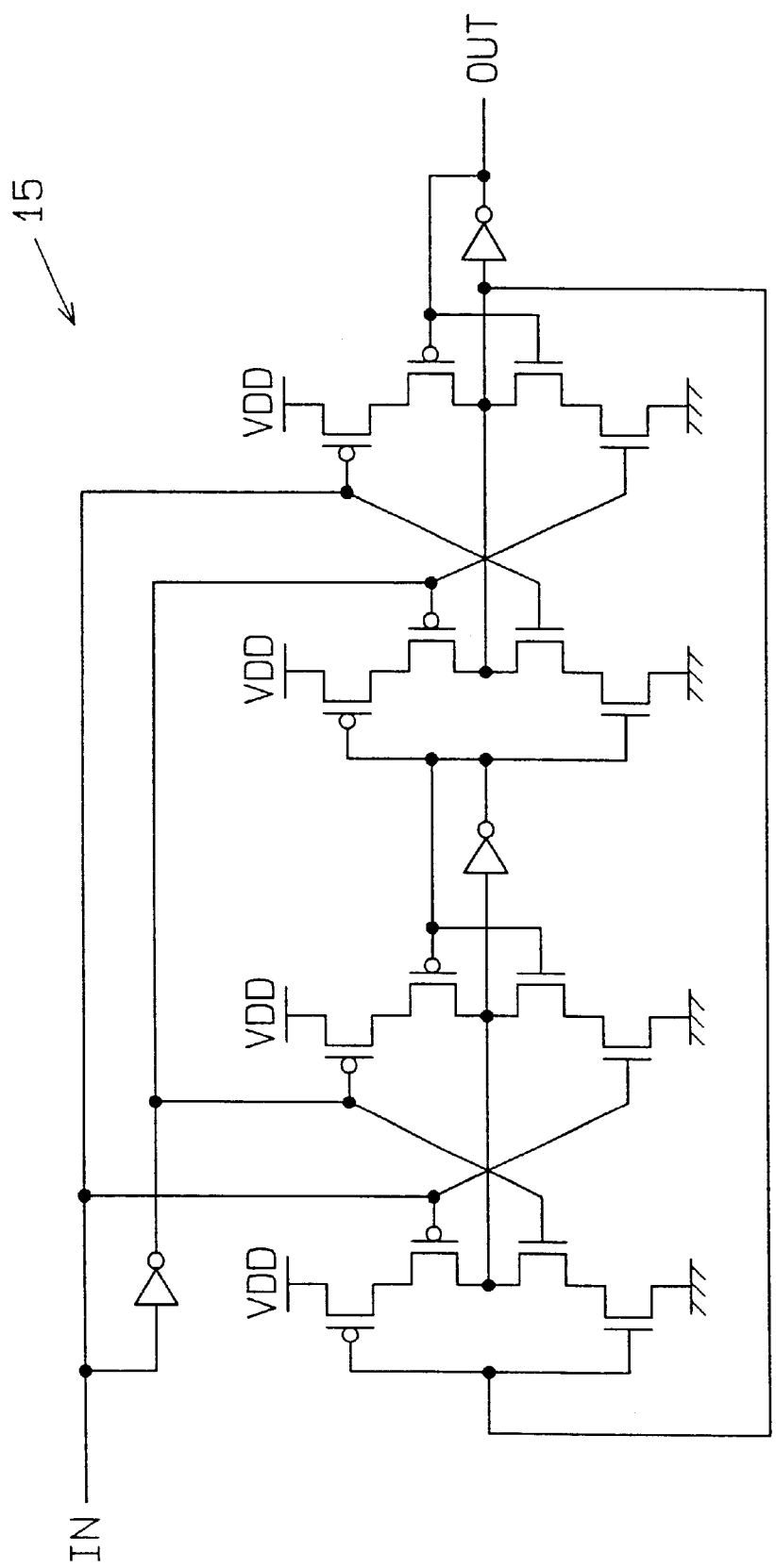
FIG. 5 is a circuit diagram showing a counter of the pattern generating circuit of FIG. 4.
Figure 8:
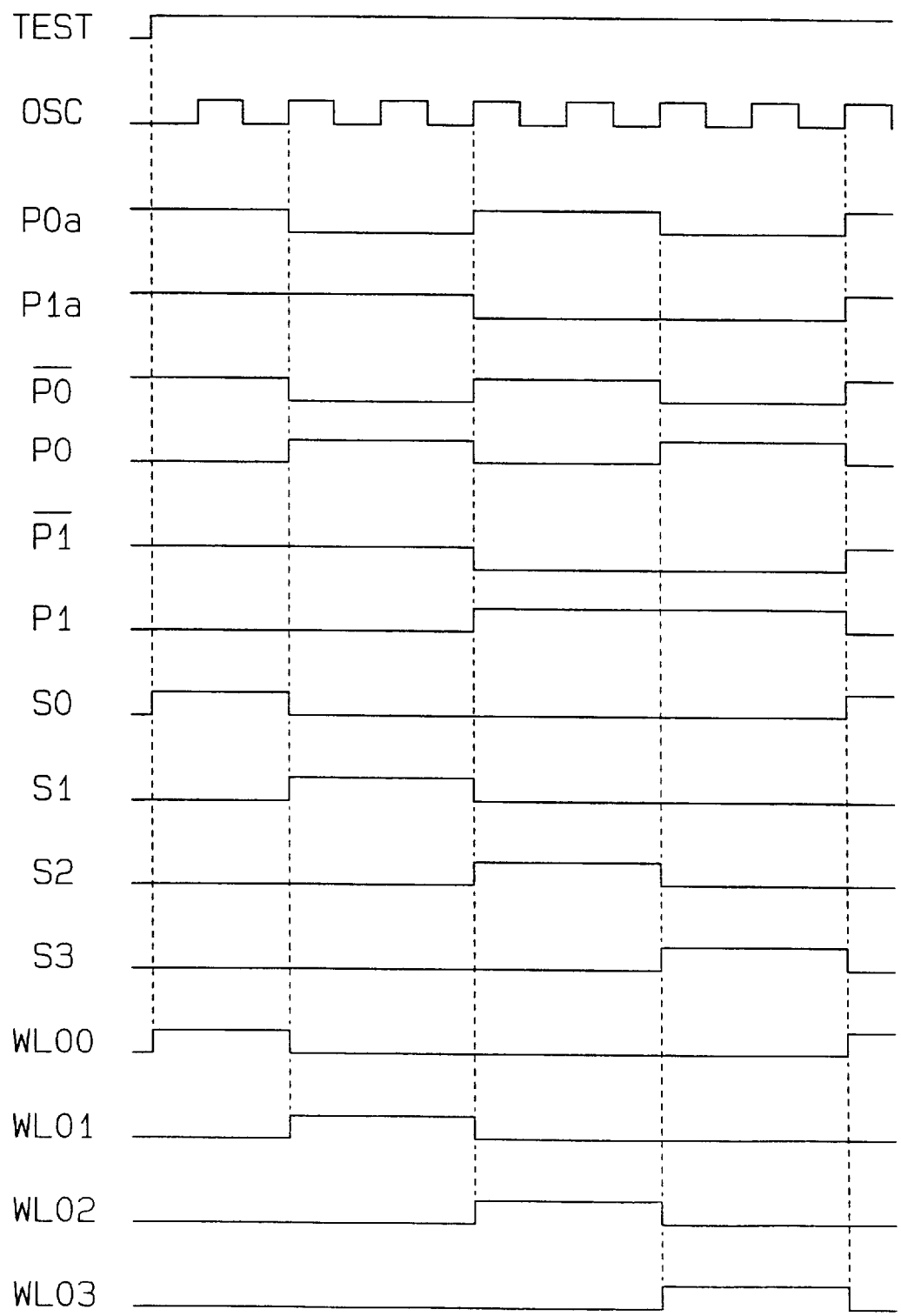
FIG. 8 is a timing chart showing the operation of the semiconductor memory device of FIG. 1.

With reference to FIG. 5, each of the counters inverts its output signal when its input signal IN rises. Accordingly, two pulses of the oscillation signal OSC invert the output signal P0a of the counter 16 and four pulses of the oscillation signal OSC invert the output signal P1a of the counter 17 (FIG. 8). The counters 15, 16, 17 need not be binary counters and other types of counters may be used instead. The number of the counters 15, 16, 17 is not limited to three. Furthermore, the output signal of any counter may be used to generate the word line selection signals P0, /P0, P1, /P1.

Figure 6:
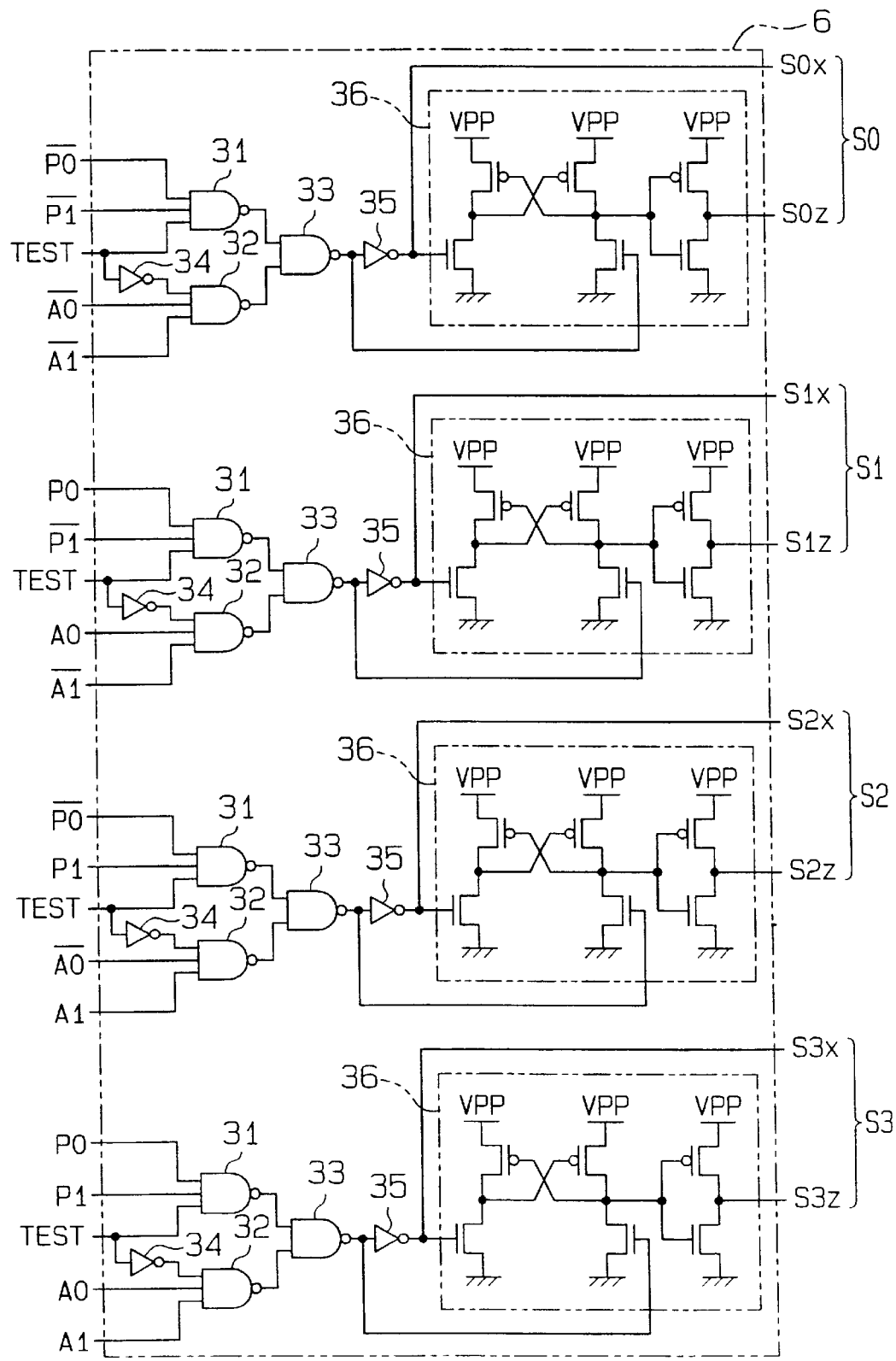
FIG. 6 is a circuit diagram showing a subword decoder of the semiconductor memory device of FIG. 1.

The subword decoder 6 will now be described. As shown in FIG. 6, for each subdecode signal S0–S3, the subword decoder 6 includes NAND circuits 31, 32, 33, inverters 34, 35, and a level converter circuit 36. The subword decoder 6 generates the subdecode signals S0–S3 in accordance with the row address signals A0, /A0, A1, /A1 or the word selection signals P0, /P0, P1, /P1.

The output operation of the subdecode signal S0 (positive phase subdecode signal S0z and negative phase subdecode signal S0x) will now be described.

The NAND circuit 31 has three input terminals for receiving the word line selection signals /P0, /P1 and the test mode signal TEST. The NAND circuit 32 has three input terminals for receiving the row address signals /A0, /A1 and the test mode signal TEST inverted by the inverter 34. A first input terminal of the NAND circuit 33 is connected to the output terminal of the NAND circuit 31, and a second input terminal of the NAND circuit 33 is connected to the output terminal of the NAND circuit 32. The output terminal of the NAND circuit 33 is connected to the input terminal of the level converter circuit 36 via the inverter 35. The inverter 35 outputs the negative phase subdecode signal S0x.

The level converter 36 inverts the output signal of the inverter 35 and outputs the positive phase subdecode signal S0z. The NAND circuits 31, 32, 33 and the inverters 34, 35 are normally driven by the internal power supply Vdd. Thus, the level converter 36 converts the input signal amplified in accordance with the internal power supply Vdd to a signal amplified in accordance with the word line drive internal power supply Vpp (positive phase sub decode signal S0z). This is to apply a voltage higher than that of the internal power supply Vdd to the gate terminals of the transistors of the memory cells 3 via the word lines WL.

During normal operation, a low test mode signal TEST is sent to the NAND circuits 31, 32, a high signal is constantly output from the NAND circuit 31, and a signal changed in accordance with the row address signals /A0, /A1 is output by the NAND circuit 32.

More specifically, when the row address signals /A0, /A1 are both high, the NAND circuit 32 outputs a low signal. The NAND circuit 33 receives the low signal from the NAND circuit 32 and the high signal from the NAND circuit 31 and outputs a high signal. Accordingly, a high (the level of the internal power supply Vpp) positive phase subdecode signal S0z is output via the inverter 35 from the level converter circuit 36 and a low negative phase subdecode signal S0x is output from the inverter 35.

When one of the row address signals /A0, /A1 is low, the NAND circuit 32 outputs a high signal. The NAND circuit 33 receives the high signal from the NAND circuit 32 and the high signal from the NAND circuit 31 and outputs a low signal. Accordingly, a low positive phase subdecode signal S0z is output via the inverter 35 from the level converter circuit 36 and a high negative phase subdecode signal S0x is output from the inverter 35.

During the test mode, a high test mode signal TEST is sent to the NAND circuits 31, 32, a high signal is constantly output from the NAND circuit 32, and a signal changed in accordance with the word line selection signals /P0, /P1 is output by the NAND circuit 31.

More specifically, when the word line selection signals /P0, /P1 are both high, the NAND circuit 31 outputs a low signal. The NAND circuit 33 receives the low signal from the NAND circuit 31 and the high signal from the NAND circuit 32 and outputs a high signal. Accordingly, a high (the level of the internal power supply Vpp) positive phase subdecode signal S0z is output via the inverter 35 from the level converter circuit 36 and a low negative phase subdecode signal S0x is output from the inverter 35.

When one of the word line selection signals /P0, /P1 is low, the NAND circuit 31 outputs a high signal. The NAND circuit 33 receives the high signal from the NAND circuit 31 and the high signal from the NAND circuit 32 and outputs a low signal. Accordingly, a low positive phase subdecode signal S0z is output via the inverter 35 from the level converter circuit 36 and a high negative phase subdecode signal S0x is output from the inverter 35.

The output operation of the subdecode signal S1 (positive phase subdecode signal S1z and negative phase subdecode signal S1x) will now be described. The associated NAND circuit 31 receives the word line selection signals P0, /P1 and the NAND circuit 32 receives the row address signals A0, /A1.

During normal operation, when the row address signals A0, /A1 are both high, a high positive phase subdecode signal S1z and a low negative phase subdecode signal S1x are output. If one of the row address signals A0, /A1 are low, a low positive phase subdecode signal S1z and a high negative phase subdecode signal S1x are output.

During the test mode, when the word line selection signals P0, /P1 are both high, a high positive phase subdecode signal S1z and a low negative phase subdecode signal S1x are output. If one of the word line selection signals P0, /P1 are low, a low positive phase subdecode signal S1z and a high negative phase subdecode signal S1x are output.

The output operation of the subdecode signal S2 (positive phase subdecode signal S2z and negative phase subdecode signal S2x) will now be described. The associated NAND circuit 31 receives the word line selection signals /P0, P1 and the NAND circuit 32 receives the row address signals /A0, A1.

During normal operation, when the row address signals /A0, A1 are both high, a high positive phase subdecode signal S2z and a low negative phase subdecode signal S2x are output. If one of the row address signals /A0, A1 are low, a low positive phase subdecode signal. S2z and a high negative phase subdecode signal S2x are output.

During the test mode, when the word line selection signals /P0, P1 are both high, a high positive phase subdecode signal S2z and a low negative phase subdecode signal S2x are output. If one of the word line selection signals /P0, P1 are low, a low positive phase subdecode signal S2z and a high negative phase subdecode signal S2x are output.

The output operation of the subdecode signal S3 (positive phase subdecode signal S3z and negative phase subdecode signal S3x) will now be described. The associated NAND circuit 31 receives the word line selection signals P0, P1 and the NAND circuit 32 receives the row address signals A0, A1.

During normal operation, when the row address signals A0, A1 are both high, a high positive phase subdecode signal S3z and a low negative phase subdecode signal S3x are output. If one of the row address signals A0, A1 are low, a low positive phase subdecode signal S3z and a high negative phase subdecode signal S3x are output.

During the test mode, when the word line selection signals P0, P1 are both high, a high positive phase subdecode signal S3z and a low negative phase subdecode signal S3x are output. If one of the word line selection signals P0, P1 are low, a low positive phase subdecode signal S3z and a high negative phase subdecode signal S3x are output.

Figure 7:
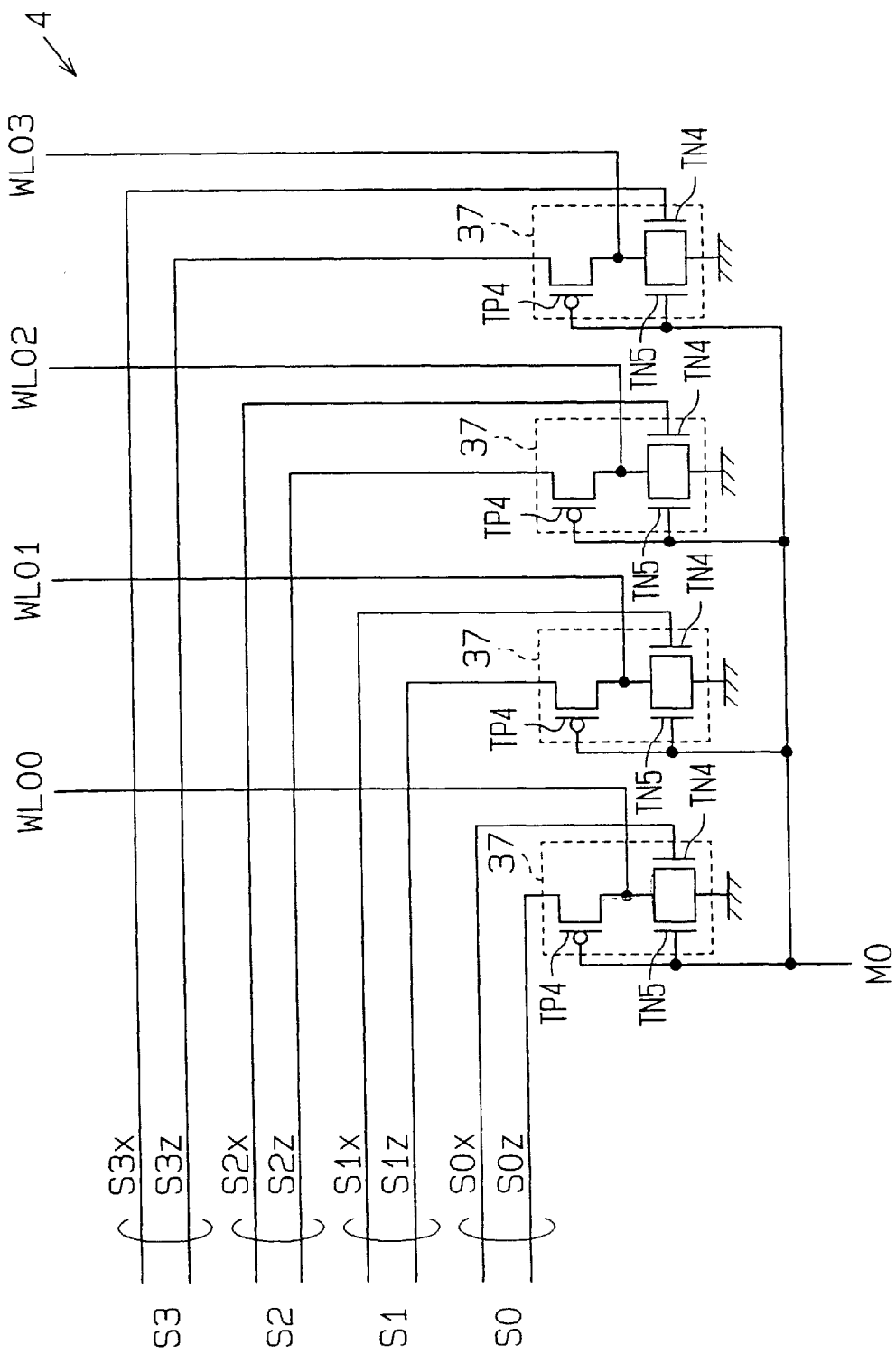
FIG. 7 is a circuit diagram showing a word driver of the semiconductor memory device of FIG. 1.

The operation of the word driver 4 will now be described. As shown in FIG. 7, each of the word lines WL00–WL03 is connected to and driven by an associated CMOS inverter circuit 37. The CMOS inverter circuit 37 is formed by a PMOS transistor TP4 and two NMOS transistors TN4, TN5. The drain terminal of the PMOS transistor TP4 is connected to the drain terminals of the NMOS transistors TN4, TN5. The node between the drain terminal of the PMOS transistor TP4 and the drain terminals of the NMOS transistors TN4, TN5 is connected to the associated word line. The main decode signal M0 is received by the gate terminal of each PMOS transistor TP4 and each NMOS transistor TN5. The positive phase subdecode signals S0z–S3z are received by the source terminal of each PMOS transistor TP4, and the negative phase subdecode signals S0x–S3x are received by the gate terminal of each NMOS transistor TN4.

When a low main decode signal M0 is sent to the gate terminals of each PMOS transistor TP4 and each NMOS transistor TN5, the PMOS transistors TP4 are activated and the NMOS transistors TN5 are deactivated. The activated PMOS transistors TP4 send the corresponding positive phase subdecode signals S0z–S3z to the associated word lines WL00–WL03. That is, when high positive phase subdecode signals S0z–S3z are provided, the associated word lines WL00–WL03 are selected. When low positive phase subdecode signals S0z–S3z are provided, the associated word lines WL00–WL03 are not selected.

The NMOS transistors TN4 are activated in response to high negative phase subdecode signals S0x–S3x. This grounds the unselected word lines WL00–WL03 and prevents those word lines from floating.

When a high main decode signal M0 is sent to the gate terminals of each PMOS transistor TP4 and each NMOS transistor TN5, the PMOS transistors TP4 are deactivated and the NMOS transistors TN5 are activated. Thus, the word lines WL00–WL03 are not selected regardless of the level of the positive phase subdecode signals S0z–S3z. Likewise, the word drivers 4 provided for each group of word lines is activated by low main decode signals M1–Mn and the word lines WL are selected or unselected in accordance with the subdecode signals S0–S3.

The operation of the semiconductor memory device 1 will now be described. During normal operation, the main word decoder 5 causes one of the main decode signals M0–Mn (e.g., the main decode signal M0) to go low in accordance with the address signals A2–Ai. The subword decoder 6 causes one of the subdecode signals S0–S3 to go high in accordance with the address signals A0, A1. For example, if the address signals A0, A1 are both low (the address signals /A0, /A1 are both high), the subdecode signal S0 (positive phase subdecode signal S0z) goes high. That is, the CMOS inverter circuit 37 of the word driver 4 is activated by the low main decode signal M0 and the high subdecode signal S0 selects the word line WL00. Data is then written to or read from the memory cell connected to the intersection of the selected word line WL00 and the bit line BL selected by the column decoder (not shown).

During the test mode, upon receipt of the test mode entry signal TESTE, the test mode circuit 7 sends a high test mode signal TEST to the main word decoder 5, the subword decoder 6, and the oscillator circuit 8. In response to the high test mode signal TEST, the main word decoder 5 sends the main decode signals M0–Mn, which are all low, to the word drivers 4. This activates all of the word drivers 4.

The operation of the semiconductor memory device 1 during the test mode will now be described with reference to the timing charts of FIGS. 8 to 10.

[When the Control Signals Row-ST and All-Hi are Low]

The oscillator circuit 8 is activated by a high test mode signal TEST and outputs an oscillation signal OSC having a predetermined cycle. The pattern generating circuit 9 outputs the word line selection signals P0, /P0, P1, /P1 in accordance with the oscillation signal OSC and the control signals Row-ST, All-Hi.

More specifically, with reference to FIGS. 4 and 8, when the pattern generating circuit 9 receives two pulses of the oscillation signal OSC, the output signal P0a of the counter 16 is inverted. When the pattern generating circuit 9 receives four pulses of the oscillation signal OSC, the output signal P1a of the counter 17 is inverted. The NAND circuit 18 receives a high control signal All-Hi inverted by the inverter 21 and the output signal P0a from the counter 16 and outputs the inverted output signal P0a, or the word line selection signal P0. The NAND circuit 20 receives a high control signal All-Hi inverted by the inverter 21 and the output signal P0a inverted by the inverter 19 and outputs the word line selection signal /P0 which level is substantially the same as the output signal P0a. In other words, the word line selection signal P0 corresponds to the inverted word line selection signal /P0.

The NAND circuit 22 receives a high control signal Row-ST inverted by the inverter 28 and the output signal P1a from the counter 17 and outputs the inverted output signal P1a, or the word line selection signal P1. The low control signal All-Hi activates the transmission gate 24 and deactivates the transmission gate 26. Thus, the NAND circuit 25 receives the output signal P1a inverted by the inverter 23 from the counter 17 and a high control signal Row-ST inverted by the inverter 28 and outputs the word line selection signal /P1 which level is substantially the same as the output signal P1a. In other words, the word line selection signal P1 corresponds to the inverted word line selection signal /P1.

The subword decoder 6 outputs the subdecode signals S0–S3 in accordance with the word line selection signals P0, /P0, P1, /P1 from the pattern generating circuit 9. That is, with reference to FIG. 6, a high test mode signal TEST constantly maintains the output signal of each NAND circuit 32 at a high level and causes the subdecode signals S0–S3 to be output in accordance with the word line selection signals P0, /P0, P1, /P1 received by the NAND circuits 31.

Accordingly, with reference to FIG. 8, if the output signals P0a, P1a from the associated counters 16, 17 of the pattern generating circuit 9 are both high, the word line selection signals P0, P1 output by the pattern generating circuit 9 are both low (the word line selection signals /P0, /P1 are both high). This causes the subword decoder 6 to output a high subdecode signal S0 and low subdecode signals S1, S2, S3.

Afterward, when two pulses of the oscillation signal OSC are received by the pattern generating circuit 9, the output signal P0a is inverted and the pattern generating circuit 9 outputs a high word line selection signal P0 (low word line selection signal /P0). This causes the subword decoder 6 to output a high subdecode signal S1 and low subdecode signals S0, S2, S3.

When two more pulses of the oscillation signal OSC are received by the pattern generating circuit 9, the output signals P0a, P1a are inverted. Accordingly, the pattern generating circuit 9 outputs a low word line selection signal P0 and a high word line selection signal P1 (high word line selection signal /P0 and low word line selection signal /P1). This causes the subword decoder 6 to output a high subdecode signal S2 and low subdecode signals S0, S1, S3.

If another two more pulses of the oscillation signal OSC are received by the pattern generating circuit 9, the output signal P0a is inverted and the pattern generating circuit 9 outputs a high word line selection signal P0 (low word line selection signal /P0). This causes the subword decoder 6 to output a high subdecode signal S3 and low subdecode signals S0, S1, S2.

When the word drivers 4 receive the subdecode signals S0–S3, the word drivers 4 select the corresponding word lines WL00–WL03. That is, every two pulses of the oscillation signal repetitively selects the word lines in the order of WL00 to WL01 to WL02 to WL03. Since all of the other word drivers 4 are also activated by the low main decode signals M0–Mn, those word drivers 4 select the corresponding word lines WL10–WL13, WL20–WL23, etc., repetitively in the same manner. For example, when the subdecode signal S0 goes high, the corresponding word lines WL are selected substantially simultaneously.

[When the Control Signal Row-ST is High and the Control Signal All-Hi is Low]

Figure 9:
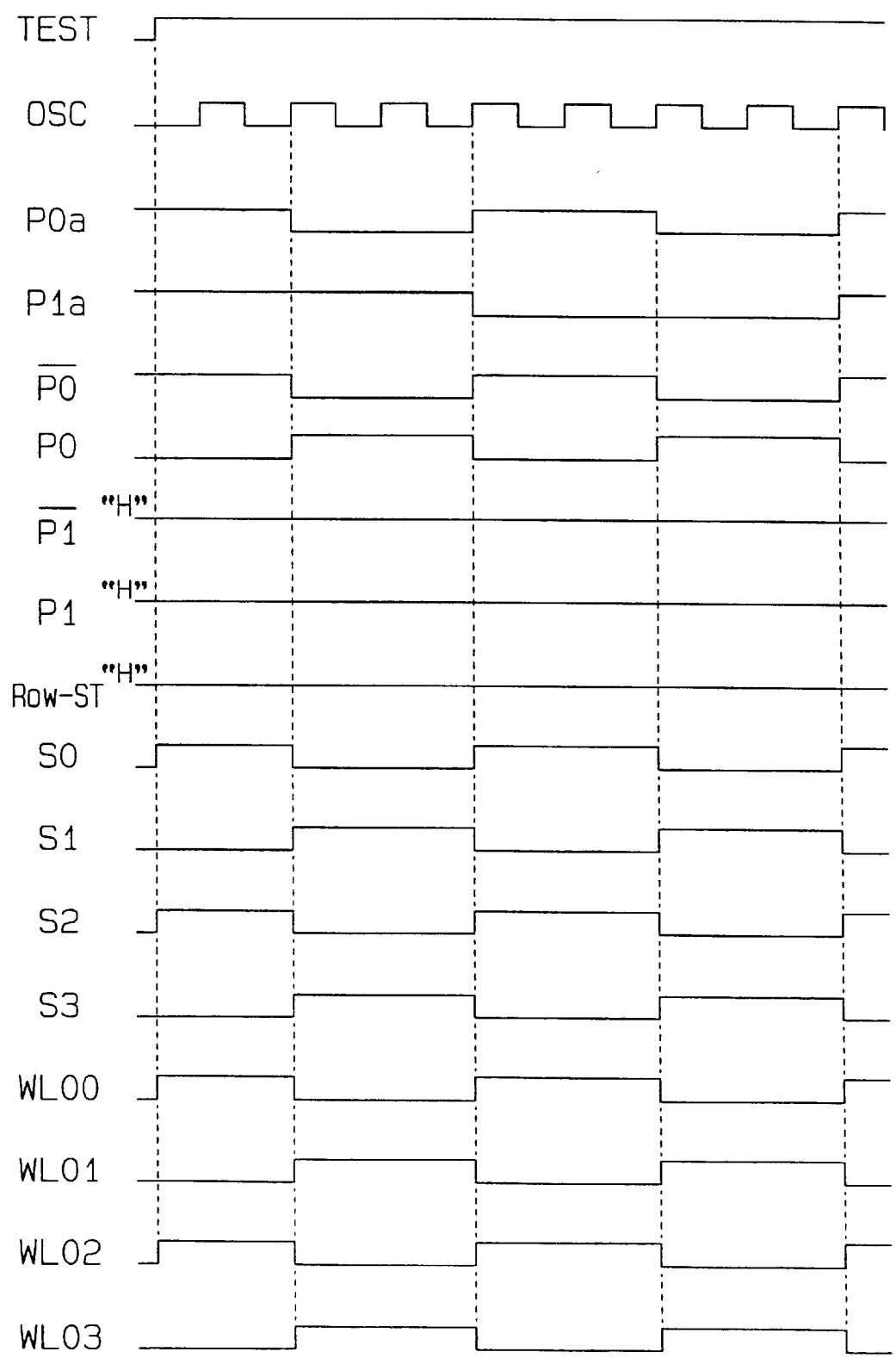
FIG. 9 is a timing chart showing the operation of the semiconductor memory device of FIG. 1.

With reference to FIGS. 4 and 9, when the high control signal Row-ST is sent to the NAND circuits 22, 25 via the inverter 28, the word line selection signals P1, /P1 output from the NAND circuits 22, 25, respectively, are constantly maintained at a high level. The subword decoder 6 outputs the subdecode signals S0–S3 in accordance with the high word line selections signals P1, /P1 and the word line selection signals P0, /P0.

Accordingly, with reference to FIG. 9, if the output signal P0a is high, the pattern generating circuit 9 outputs a low word line selection signal P0 (high word line selection signal /P0). This causes the subword decoder 6 to output high subdecode signals S0, S2 and low subdecode signals S1, S3.

Afterward, when two pulses of the oscillation signal OSC are received by the pattern generating circuit 9, the output signal P0a is inverted and the pattern generating circuit 9 outputs a high word line selection signal P0 (low word line selection signal /P0). This causes the subword decoder 6 to output low subdecode signals S0, S2 and high subdecode signals S1, S3.

The word driver 4 receives the subdecode signals S0–S3 and selects the corresponding word lines WL00–WL03. Every two pulses of the oscillation signal OSC, the word lines WL00, WL02 and word lines WL01, WL03 are selected alternately and repetitively. In other words, two word lines WL00, WL02 (or WL01, WL03) are selected substantially simultaneously. Accordingly, an AC potential difference occurs between sets of word lines (WL00, WL01), (WL01, WL02), (WL02, WL03). Since all of the other word drivers 4 are also activated by the low main decode signals M0–Mn, those word drivers 4 select the corresponding set of word lines WL10–WL13, WL20–WL23, etc., alternately and repetitively in the same manner. For example, when the subdecode signals S0, S2 are selected, the corresponding sets of word lines (WL00, WL02), (WL10, WL12), . . . (WLn0, WLn2) are selected substantially simultaneously.

[When the Control Signal Row-ST is Low and the Control Signal All-Hi is High]

Figure 10:
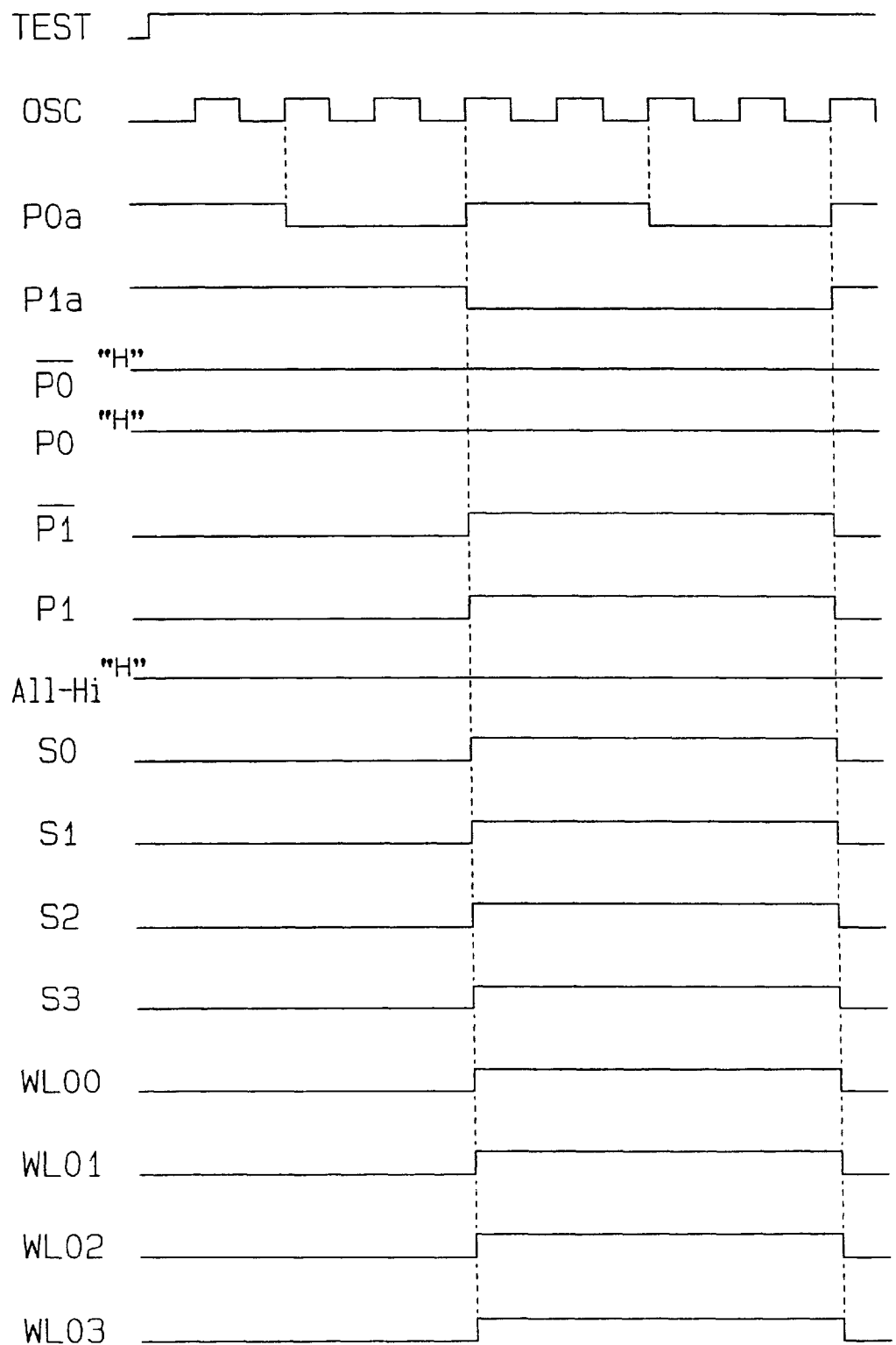
FIG. 10 is a timing chart showing the operation of the semiconductor memory device of FIG. 1.

With reference to FIGS. 4 and 10, when the high control signal All-Hi is sent to the NAND circuits 18, 20 via the inverter 21, the word line selection signals P0, /P0 output from the NAND circuits 18, 20, respectively, are constantly maintained at a high level. The high control signal All-Hi deactivates the transmission gate 24 and activates the transmission gate 26. Thus, the NAND circuit 25 receives a high control signal Row-ST inverted by the inverter 28 and the output signal P1a of the counter 17 and outputs the inverted output signal P1a, or the word line selection signal /P1. In other words, the NAND circuits 22, 25 output the associated word line selection signals P1, /P1 which correspond to the inverted output signal P1a.

Accordingly, with reference to FIG. 10, if the output signal P1a is high, the pattern generating circuit 9 outputs low word line selection signals P1, /P1. This causes the subword decoder 6 to output low subdecode signals S0–S3.

Afterward, when four pulses of the oscillation signal OSC are received by the pattern generating circuit 9, the output signal P1a is inverted and the pattern generating circuit 9 outputs high word line selection signals P1, /P1. This causes the subword decoder 6 to output high subdecode signals S0–S3.

The word driver 4 receives the subdecode signals S0–S3 and selects all of the corresponding word lines WL00–WL03. Every four pulses of the oscillation signal OSC substantially simultaneously selects all or none of the word lines WL00–WL03. Accordingly, the potential difference between the four word lines WL00–WL03 is null. That is, a DC potential difference occurs. Since all of the other word drivers 4 are also activated, those word drivers 4 simultaneously select all or none of the corresponding word lines WL10–WL13, WL20–WL23, etc.

The above series of operations are performed until the test mode is completed. The test mode is completed when the test mode circuit 7 sends a low test mode signal TEST to the main word decoder 5, the subword decoder 6, and the oscillator circuit 8. It is preferable that the bit lines BL be set at the ground level to apply stress to the transistors of the memory cells 3 during the test mode.

The preferred and illustrated embodiment has the advantages described below.

(1) During the test mode, if the main word decoder 5 and the subword decoder 6 receive the test mode signal TEST, all of the word drivers 4 are activated by the main word decoder 5, and the predetermined word lines in the group of word lines connected to each word driver 4 are selected by the subword decoder 6. The selected word lines are driven by the word driver 4. Accordingly, a larger number of word lines are driven during the test mode in comparison to the number of word lines driven in accordance with the address signals A0–Ai during normal operation. As a result, DC/AC stress is applied simultaneously to plural word lines. Furthermore, AC stress is applied between word lines. Accordingly, DC/AC stress is applied to all of the word lines WL and AC stress is applied between the word lines WL. This means that burn-in, which screens out initial state failures, is conducted in a short period of time. This decreases the testing time of the semiconductor memory device 1.

(2) The test mode circuit 7, the oscillator circuit 8, and the pattern generating circuit 9 generate test patterns in the semiconductor memory device 1. Accordingly, special pattern signals or address signals need not be provided by external apparatuses. This decreases the burden of the external testing apparatus.

(3) The number of word line selection signals P0, /P1, P1, /P1 is the same as the number of subdecode signals S0–S3. This facilitates the generation of testing patterns. In other words, testing patterns used to conduct the burn-in are performed effectively.

(4) With reference to FIG. 9, adjacent word lines WL00, WL01, etc., are selected alternately to apply AC stress between the adjacent word lines WL00, WL01, etc. Since half of all the word lines WL rise simultaneously, the selection time is half of that when all of the word lines WL are selected (FIG. 8). Furthermore, the relatively long time for selecting all of the word lines WL applies DC stress to the word lines WL. A new fixed pattern may be added in a state in which all of the word lines WL are selected in order to apply DC stress.

(5) The power consumption of the semiconductor memory device 1 is decreased by forming the word drivers 4 with the CMOS inverter circuits 37.

(6) Since special elements need not be added to the word drivers 4, chip area is saved.

It should be apparent to those skilled in the art that the present invention may be embodied in many other specific forms without departing from the spirit or scope of the invention. Particularly, it should be understood that the present invention may be embodied in the following forms.

Figure 11:
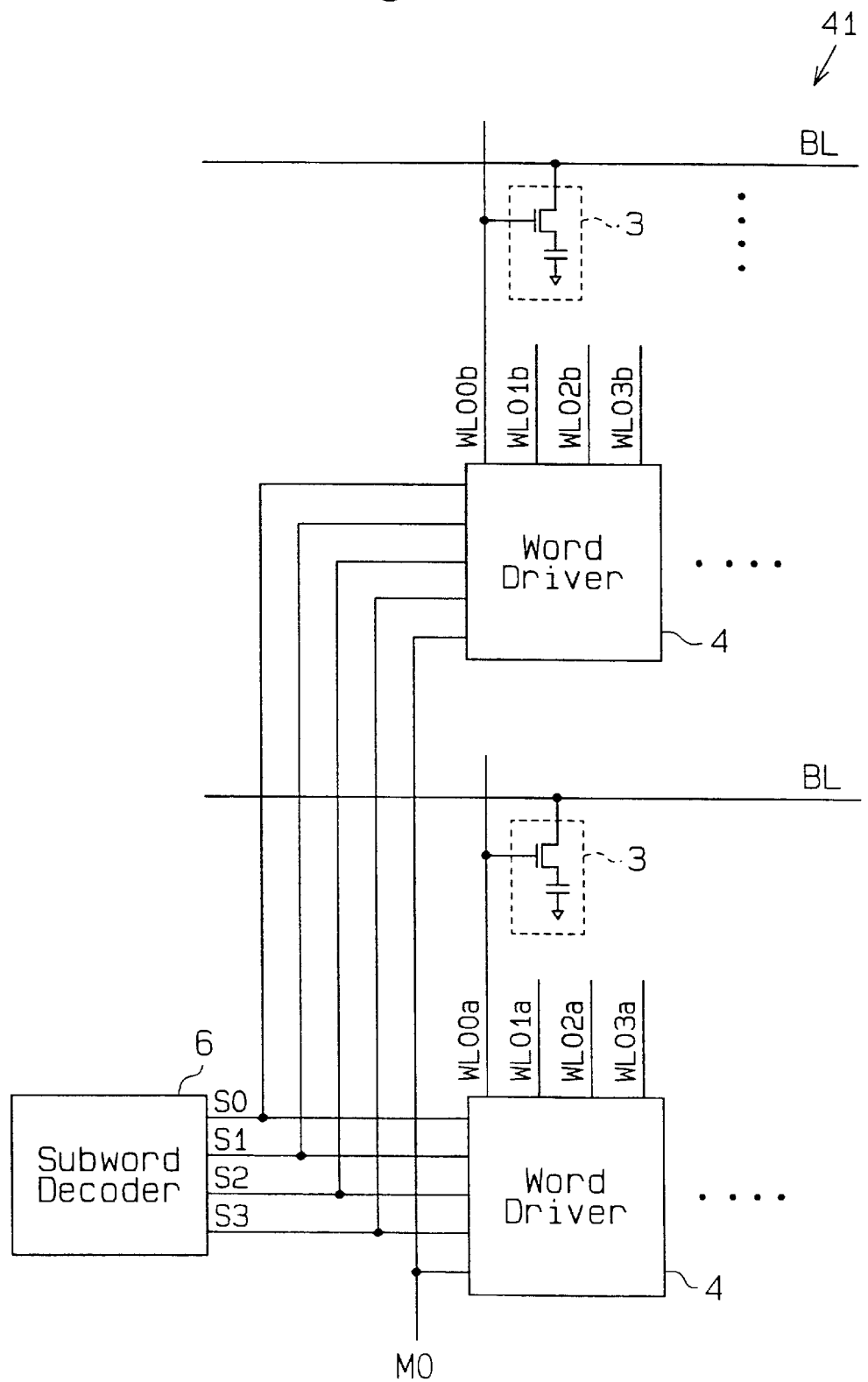
FIG. 11 is a schematic block diagram showing a semiconductor memory device according to a further embodiment of the present invention.

(1) The present invention may be applied to a semiconductor memory device that selects plural word lines in accordance with the address signals A0–Ai during normal operation. For example, with reference to FIG. 11, the present invention may be applied to a subword type semiconductor device 41 that selects two word lines with the same address signal. The subword decoder 6 and the word drivers 4 are identical to those of FIG. 1. Although not shown in FIG. 11, the main word decoder 5, the test mode circuit 7, the oscillator circuit 8, and the pattern generating circuit 9 of FIG. 1 are incorporated in the semiconductor device 41 of FIG. 11. During normal operation, one main decode signal (e.g., the main decode signal M0) and one subdecode signal (e.g., the subdecode signal S0) are selected in accordance with the address signals A0–Ai. In this state, the word lines WL00a and WL00b connected to the respective word drivers 4 are selected. In the test mode, all of the main decode signals M0–Mn are selected and, as shown in FIGS. 8 to 10, the subdecode signals S0–S1 are selected.

(2) The test mode circuit 7 may be arranged external to the semiconductor memory device 1. In this case, a test mode signal TEST is provided from an external input device that includes the test mode circuit 7 in order to select the predetermined word lines WL with the test mode signal TEST. Furthermore, the oscillator circuit 8 and the pattern generating circuit 9 may be arranged external to the semiconductor memory device 1. In this case, the word selection signals P0, /P0, P1, /P1 are provided from an external input device that includes the oscillator circuit 8 and the pattern generating circuit 9.

(3) The word line selection signals P0, /P0, P1, /P1 may be generated by a pattern generating circuit 9 that includes registers instead of the counters 15, 16, 17. In this case, different pattern data is stored in each register. The register selects one pattern data in accordance with the control signals Row-ST, All-Hi and outputs word line selection signals P0, /P0, P1, /P1 in accordance with the pattern data selected in response to the oscillation signal OSC. This structure facilitates the alteration of patterns.

(4) The circuit structure of the main word decoder 5 and the subword decoder 6 may be modified so that, for example, the main decode signals M0–Mn are selected alternately when all of the subdecode signals S0–S3 are selected. Such a structure also applies AC stress to all of the word lines.

(5) The word lines driven by the word driver 4 is not limited to four. The number of the subdecode signals S0–S3 and the number of the word line selection signals P0, /P0, P1, /P1 sent to the subword decoder 6 are also not limited. For example, if one high word selection signal is sent to the subword decoder 6, the subword decoder 6 may output the subdecode signals S0–S1 as shown in FIGS. 6 to 9. If a low word selection signal is sent to the subword decoder 6, the subdecode signals S0–S1 may be generated so that all of them and none of them are selected alternately in a repetitive manner.

(6) The present invention may be embodied in a semiconductor memory device other than a DRAM (dynamic random access memory) such as an SRAM (static random access memory).

The present examples and embodiments are to be considered as illustrative and not restrictive, and the invention is not to be limited to the details given herein, but may be modified within the scope and equivalence of the appended claims.

What is claimed is:

1. A semiconductor memory device comprising:
    a memory cell array including a plurality of memory cells, each arranged at an intersection between one of a plurality of word lines and one of a plurality of bit lines, wherein the plurality of word lines form a plurality of word line groups;
    a plurality of driver circuits, each connected to one of the plurality of word line groups;
    a first decoder circuit connected to the plurality of driver circuits to selectively at activate the driver circuits;
    a second decoder circuit connected to the plurality of driver circuits to select predetermined ones of the word lines in each of the plurality of word line groups, wherein the first decoder circuit substantially simultaneously activates the plurality of driver circuits in response to a test mode signal and the second decoder circuit selects the predetermined word lines in a predetermined pattern in response to the test mode signal;
    a test mode circuit connected to the first and second decoder circuits to send the test mode signal to the first and second decoder circuits;
    an oscillator circuit connected to the test mode circuit to generate an oscillation signal having a predetermined cycle in response to the test mode signal; and
    a pattern generating circuit connected to the oscillator circuit and the second decoder to send a word line selection signal having the predetermined pattern to the second decoder circuit in accordance with the oscillation signal.

2. The semiconductor memory device according to claim 1, wherein the pattern generating circuit includes a counter for counting pulses of the oscillation signal to generate the word selection signal.

3. The semiconductor memory device according to claim 1, wherein the pattern generating circuit includes a register for storing the word selection signal and outputting the word selection signal in accordance with the oscillation signal.

4. The semiconductor memory device according to claim 1, further comprising a pattern generating circuit connected to the second decoder circuit to send a word line selection signal having the predetermined pattern to the second decoder circuit.

5. The semiconductor memory device according to claim 4, wherein the pattern generating circuit provides the second decoder circuit with the word line selection signal having a pattern for alternately selecting adjacent word lines.

6. The semiconductor memory device according to claim 4, wherein the pattern generating circuit provides the second decoder circuit with the word line selection signal having a pattern for selecting the word lines of each of the word line groups in sequential order.

7. The semiconductor memory device according to claim 4, wherein the pattern generating circuit provides the second decoder circuit with the word line selection signal having a pattern for simultaneously selecting all of the word line groups.

8. The semiconductor memory device according to claim 4, wherein the pattern generating circuit selects one of a plurality of stored predetermined patterns in accordance with a control signal and sends the selected word selection signal having the predetermined pattern to the second decoder.

9. The semiconductor memory device according to claim 1, wherein the second decoder circuit sends a subdecode signal associated with a word line selection signal to the plurality of driver circuits, and wherein the activated driver circuit receives the subdecode signal from the second decoder circuit and drives the word line associated with the subdecode signal.

10. The semiconductor memory device according to claim 9, wherein the second decoder circuit provides all of the driver circuits with the subdecode signal associated with the word line selection signal having the predetermined pattern in accordance with the test mode signal.

11. The semiconductor memory device according to claim 9, wherein the number of the word line selection signals is the same as or less than the number of subdecode signals.

12. The semiconductor memory device according to claim 9, wherein the second decoder circuit generates the subdecode signal in accordance with an address signal during a normal mode and generates the subdecode signal in accordance with the word line selection signal during a test mode.

13. The semiconductor memory device according to claim 1, wherein each of the driver circuits includes a CMOS inverter.

14. A semiconductor memory device comprising:
a memory cell array including a plurality of memory cells, each arranged at an intersection between one of a plurality of word lines and one of a plurality of bit lines, wherein the plurality of word lines form a plurality of first word line groups and a plurality of second word line groups;
a plurality of first driver circuits and a plurality of second driver circuits connected to the plurality of first word line groups and the plurality of second word line groups, respectively;
a first decoder circuit connected to the plurality of first driver circuits and the plurality of second driver circuits to selectively activate the first and second driver circuits;
a second decoder circuit connected to the plurality of first driver circuits and the plurality of second driver circuits to select predetermined word lines in each of the plurality of first and second word line groups, wherein the first decoder circuit substantially simultaneously activates the plurality of first and second driver circuits in accordance with a test mode signal and the second decoder circuit selects the predetermined word lines in a predetermined pattern in accordance with the test mode signal;
a test mode circuit connected to the first and second decoder circuits to send the test mode signal to the first and second decoder circuits;
an oscillator circuit connected to the test mode circuit to generate an oscillation signal having a predetermined cycle in response to the test mode signal; and
a pattern generating circuit connected to the oscillator circuit and the second decoder to send a word line selection signal having the predetermined pattern to the second decoder circuit in accordance with the oscillation signal.

15. The semiconductor memory device according to claim 14, wherein the predetermined pattern includes a pattern that selects adjacent word lines alternately.

16. The semiconductor memory device according to claim 14, wherein the predetermined pattern includes a pattern that selects the word lines of each word line group in sequential order.

17. The semiconductor memory device according to claim 14, wherein the predetermined pattern includes a pattern that simultaneously selects all of the word lines in each of the word line groups.

* * * * *